United States Patent

Uratsuji

Patent Number: 5,240,421
Date of Patent: Aug. 31, 1993

[54] CONNECTOR

[75] Inventor: Kazumi Uratsuji, Tokyo, Japan

[73] Assignee: Yamaichi Electronics Co., Ltd., Tokyo, Japan

[21] Appl. No.: 991,965

[22] Filed: Dec. 17, 1992

[30] Foreign Application Priority Data

Dec. 20, 1991 [JP] Japan ................. 3-355994

[51] Int. Cl.⁵ .............................................. H05K 1/00
[52] U.S. Cl. ...................................... 439/72; 439/71
[58] Field of Search ............................ 439/68–73, 439/330, 331; 361/413, 400

[56] References Cited

U.S. PATENT DOCUMENTS

| | | | |
|---|---|---|---|
| 4,494,807 | 1/1985 | Cosmo | 439/71 |
| 4,630,875 | 12/1986 | Korunsky et al. | 439/73 |
| 4,887,969 | 12/1989 | Abe | 439/73 |
| 4,984,991 | 1/1991 | Nishimoto | 439/70 |
| 5,109,980 | 5/1992 | Matsuoka et al. | 439/73 |

FOREIGN PATENT DOCUMENTS 3-71746  11/1991  Japan .

Primary Examiner—David L. Pirlot
Attorney, Agent, or Firm—Wenderoth Lind & Ponack

[57] ABSTRACT

Contacting nose portions (5) and positioning knob portions (7) are formed side by side on contacting elements (4) of contacts (2) respectively. A positioning member (8) is disposed across the contacting elements (4) group. By inserting the positioning knob portions (7) into the positioning holes 9 formed in the positioning member (8) respectively, the adjacent contacting elements (4) and the adjacent contacting nose portions (5) can be isolated, and relative position can be obtained.

6 Claims, 5 Drawing Sheets

CONNECTOR

BACKGROUND OF THE INVENTION

1. Field of the Invention

This invention relates to a connector used for an electric part such as an IC, a circuit board or the like.

2. Brief Description of the Prior Art

A connector used for an IC, etc. comprises a connector main body, and a plurality of connectors arranged in array on the connector body at narrow pitches, each contact having an elastically shiftable contacting element, the contacting element being provided with a contacting nose portion, the contacting nose portion being press contacted with a terminal of an IC, etc. by resilient force of the contacting element. As means for isolating adjacent contacts, Japanese Patent Publication No. Hei 3-71746 discloses a construction in which contact positioning holes or grooves are formed in an outer peripheral portion of an IC platform, and by inserting the contacting nose portions of the contacting elements into the holes or grooves and by interposing a positioning hole forming wall or groove forming wall between adjacent contacting nose portions, the contacting elements are regulated.

In the above prior art, since the hole forming wall, etc. interposed between the adjacent contacting nose portions linearly arranged are used as isolation means, this means is equivalent to the means in which the adjacent contacting elements are isolated by interposing a partition wall, which is integral with the connector main body, between the adjacent contacting elements. In any case, it is required to form the isolation wall which is to be interposed between the adjacent contacting nose portions. In such isolation means, when contact pitches become extremely narrow, formation of the isolation wall becomes difficult. Therefore, this conventional arrangement cannot cope with the tendency for arranging contacts at narrower pitches.

If the contacting nose portions are arranged in staggered relation, the above problem can be obviated. However, since the contacting nose portions cannot be contacted with the terminals of an IC, etc. at constant position, this arrangement is not practical. In order to realize stable contact between the contacting nose portions and the terminals of an IC, etc., it is demanded that the contacting nose portions are linearly arranged, and in the foregoing state, the adjacent contacting elements are electrically properly isolated.

SUMMARY OF THE INVENTION

It is therefore an object of the present invention to provide, in order to obviate the above problems, a connector in which adjacent contacting elements and adjacent contacting nose portions of contacts can be properly isolated without interposing partition walls between the adjacent contacting elements and between the adjacent contacting nose portions.

Another object of the present invention is to provide a connector which is capable of effectively coping with the requirement for arranging contacts at narrower pitches.

To achieve the above objects, from one aspect of the present invention, there is essentially provided with a connector comprising a connector main body formed of an insulating material, and a plurality of contacts arranged in array on said connector main body, said contacts each having an elastically shiftable contacting element, said contacting element being provided with a contacting nose portion, said contacting nose portion being press contacted with a terminal of an electric part by resilient force of said contacting element, wherein positioning knob portions are formed in the vicinity of said contacting nose portions of said contacting elements, a positioning member formed of an insulating material separately from said connector main body being disposed across said contacting elements group of said contacts arranged in array, a plurality of positioning holes corresponding to said positioning knob portions being formed in said positioning member, adjacent said contacting elements being isolated by inserting said positioning knob portions into said positioning holes respectively.

From another aspect of the invention, there is also provided a connector comprising a connector main body formed of an insulating material, a plurality of contacts had by said connector main body, elastically shiftable contacting elements formed on said contacts respectively, one end portions of said contacting elements being projected from a side surface of said connector main body, a contacting nose portion and a positioning knob portion formed side by side on a projecting end portion of each of said contacting elements, said contacting nose portion being press contacted with a terminal of an electric part by resilient force of said contacting element, and a positioning member formed of an insulating material separately from said connector main body and movable along a side surface of said connector main body, a plurality of positioning holes corresponding to said positioning knob portions being formed in said positioning member, adjacent said contacting elements being isolated by inserting said positioning knob portions into said positioning holes respectively, said positioning member being shifted in accordance with said contacting elements which are mutually isolated.

From a further aspect of the present invention, there is also provided a connector comprising a connector main body formed of an insulating material, a mounting portion for an electric part disposed at a central portion of said connector main body, a plurality of contacts arranged in array along at least two opposing sides of said mounting portion, elastically shiftable contacting elements formed on said contacts and extending toward said mounting portion, and contacting nose portions formed on said contacting elements respectively, said contacting nose portions being press contacted with terminals of said electric part by resilient force of said contacting elements, wherein positioning knob portions are formed in the vicinity of said contacting nose portions of said contacting elements, a positioning member being disposed across said elastic contacting elements group of said contacts arranged in array along each side, a plurality of positioning holes corresponding to said positioning knob portions being formed in said positioning member, adjacent said contacting elements being isolated by inserting said positioning knob portions into said positioning holes respectively, said positioning member being shifted in accordance with said contacting elements which are mutually isolated.

Difference from the prior art wherein partition walls integral with the connector main body are interposed between adjacent contacting elements, or wherein partition walls are interposed between the adjacent contacting nose portions by inserting the contacting nose portions into the positioning holes or grooves, according to the present invention, positioning knob portions are separately formed in the vicinity of the contacting nose portions of the contacting elements, and by inserting the positioning knob portions into the positioning holes formed in the positioning member separately provided from the connector main body, the adjacent contacting elements are isolated, and therefore, the adjacent contacting nose portions can be properly isolated.

Therefore, the adjacent contacting elements can be isolated by arranging the positioning knob portions and positioning holes in staggered relation while arranging the contacting nose portions linearly. As a result, the positioning knob portions and positioning holes can be formed in position convenient in view of molding without getting limitation from the above arrangement of the contacting nose portions. As a result, the present invention can effectively cope with the requirement for forming contacts at narrower pitches. Furthermore, the partition walls formed on the connector main body and platform as in the prior art can be eliminated.

Furthermore, by arranging the positioning members instead of the partition walls such that the positioning members can be shifted in accordance with the contacting elements, mutual positioning and mutual isolation of the contacting elements can be obtained properly during their shifting process. Moreover, unfavorable displacement during the shifting process can be prevented effectively.

DETAILED DESCRIPTION OF THE EMBODIMENTS

Figure 1:
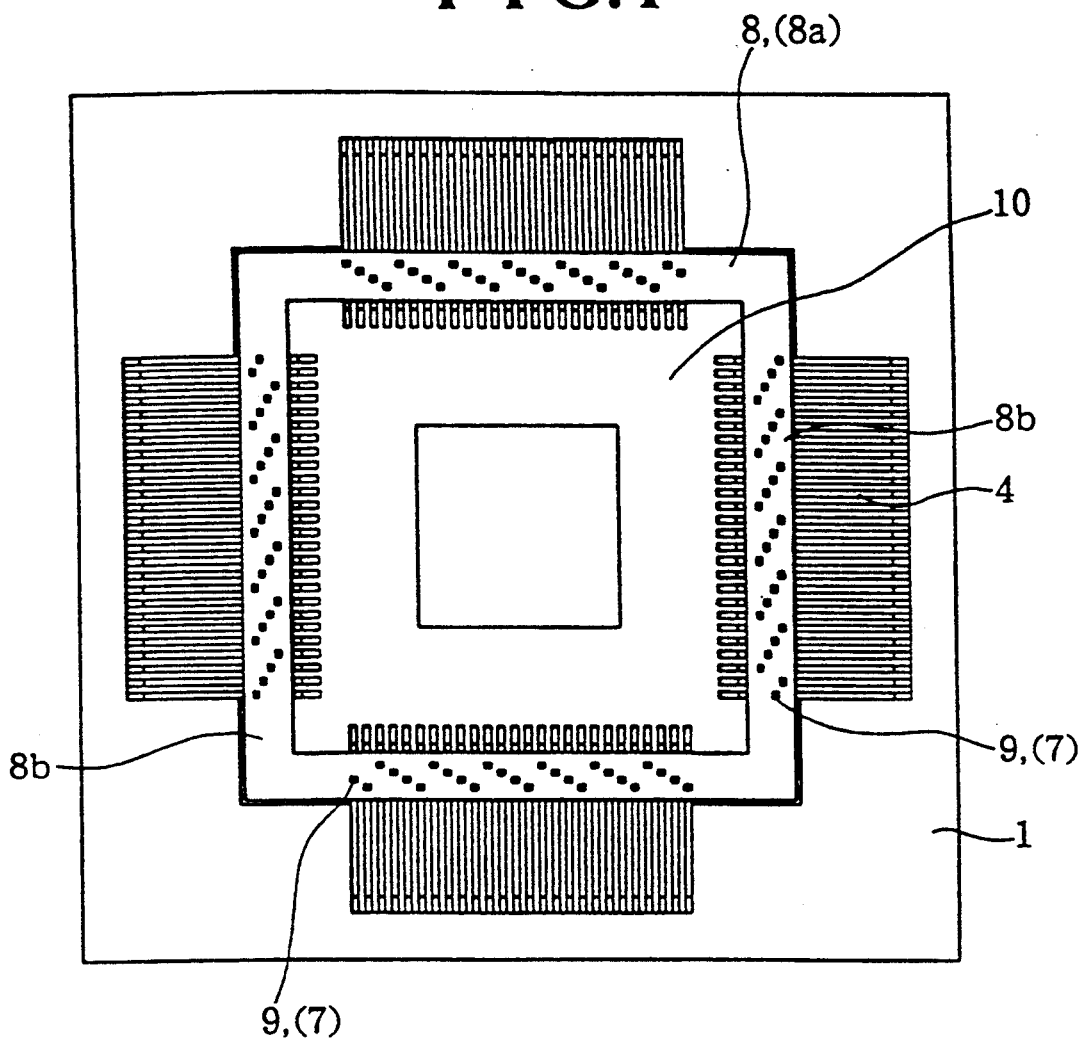
FIG. 1 is a plan view of a connector according to a first embodiment of the present invention.
Figure 2:
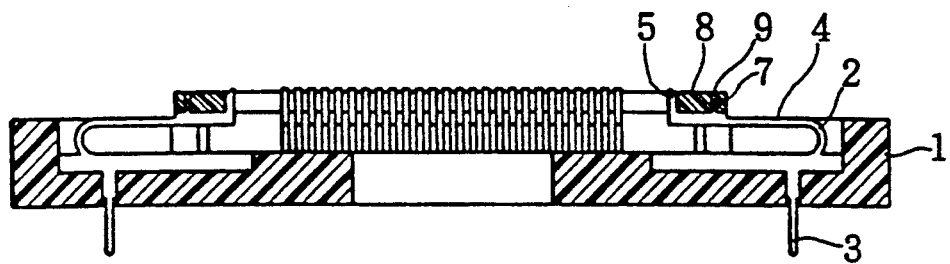
FIG. 2 is a sectional view of the above.

Several embodiments of the present invention will now be described in detail with reference to FIGS. 1 through 11 inclusive. FIGS. 1, 2, and 9 show a first embodiment, FIGS. 3, 4, 5, and 10, a second embodiment, FIG. 6, a third embodiment, and FIGS. 7, 8, and 11, a fourth embodiment, respectively.

A connector as an object of the present invention is a connector for an electric part such as an IC. The connectors of the above embodiments have a plurality of contacts 2 arranged in an array on a connector main body 1 formed of an insulating material. The contacts 2 are implanted in the connector main body 1 and each has a male terminal 3 projecting downward of the main body 1 from the implanting portion, and a contacting element 4 extending from the implanting portion to an upper surface side of the main body 1. The contacting element 4 is elastically shiftable, and has a contacting nose portion 5 formed on a free end thereof. The contacting nose portion 5 is press contacted with the terminal of the electric part by resilient force of the contacting element 4.

Figure 5:
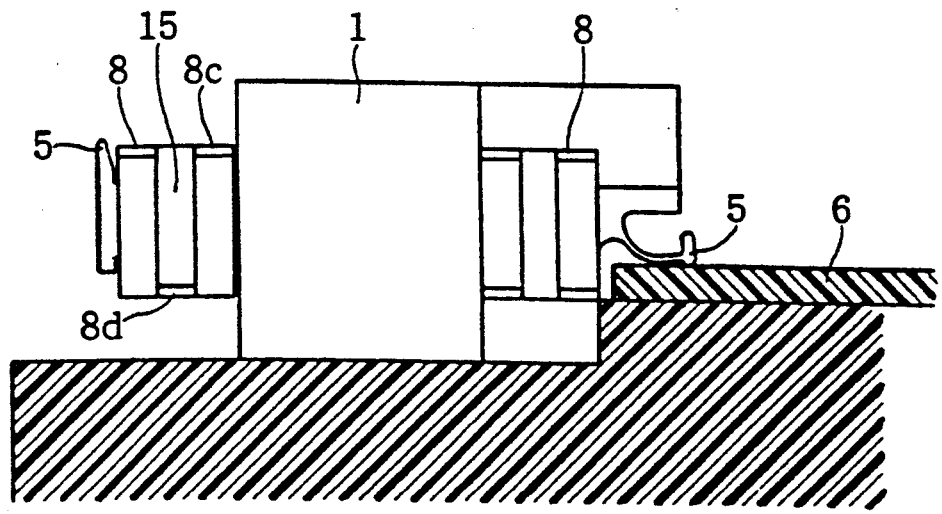
FIG. 5 is a side view of the above.
Figure 6:
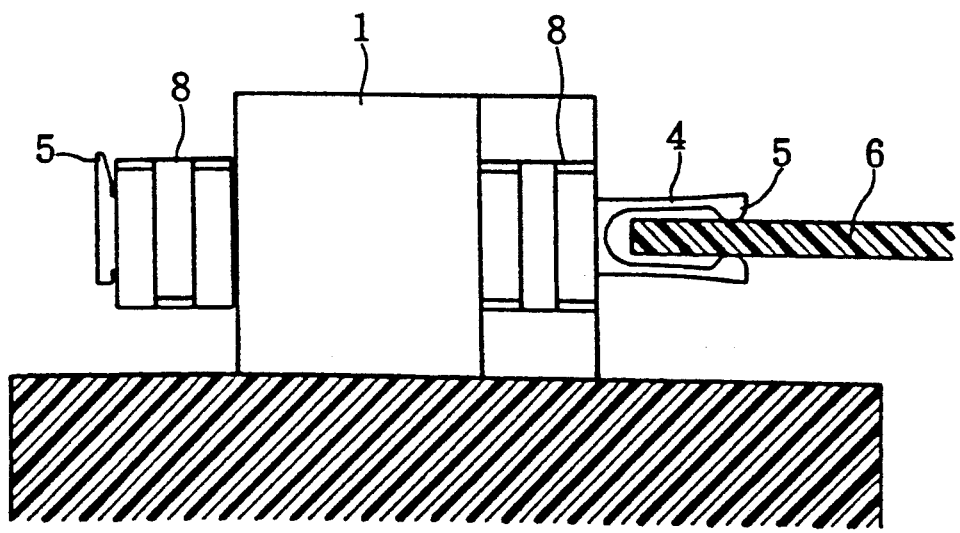
FIG. 6 is a side view of a connector according to a third embodiment of the present invention.

An example of the electric part includes an IC or circuit boards such as a printed wire board and a plasma display. FIGS. 5, 6, etc. show the electric part 6.

The contacting element 4 is provided with a positioning knob portion 7 projecting from the vicinity of the contacting nose portion 5. On the other hand, a positioning member 8 formed of an insulating material as a separate part from the connector main body 1 is prepared. The positioning member 8 is provided with a corresponding number of positioning holes 9 to the contacting nose portions 5 beforehand. The positioning member 8 is disposed across the contacting elements 4 group of the contacts 2 which are arranged in array, and the positioning knob portions 7 are inserted into the corresponding positioning holes 9 in order to obtain relative positions of the contacting elements 4 of the contacts 2 respectively, and the contacting nose portions 5 are linearly arranged along the positioning member 8.

Owing to the above arrangement, it is no more required to dispose a partition wall integral with the connector main body 1 between adjacent contacting elements 4 as in the prior art. The partition wall is not required to be disposed between adjacent contacting nose portions 5 which are linearly arranged, either. As a consequence, adjacent contacting elements and adjacent contacting nose portions can be isolated properly without giving rise to such inconvenient problems attributable to the provision of the partition wall.

The positioning knob portions 7 are staggered relative to each other so that pitches between adjacent positioning holes 9 are increased in order to facilitate easy formation thereof. Owing to the foregoing arrangement, it can effectively cope with the requirement for forming terminals of an IC, etc. at narrower pitches.

The positioning member 8 is shiftable in accordance with elastic shifting (deformation) of the contacting elements 4.

The positioning member is either movable as mentioned above, or fixed as shown in FIG. 4. The numeral 8 denotes a movable positioning member, and 8', a stationary positioning member, respectively.

Next, a construction specific to the first embodiment of the present invention will be described with references to FIGS. 1, 2 and 9. A mounting portion 10 for the electric part is formed at a central portion of the connector main body 1 which is formed of an insulating material. The connector main body 1 is provided with a plurality of contacts arranged in array along four sides or opposing two sides around the mounting portion 10. The elastically shiftable contacting element 4 of each contact 2 extends toward the mounting portion 10. A free end of the contacting element 4 is provided with the contacting nose portion 5 and the positioning knob portion 7 both projecting upward and arranged side by side. A terminal of the electric part such as an IC mounted on the mounting portion 10 is placed on the contacting nose portion 5. Then, by pushing down the electric part main body and its terminal, the contacting element 4 is flexed against its elasticity, and a contacting pressure with respect to the terminal of the electric part is obtained by reaction thereof.

On the other hand, the positioning member 8 is formed of a separate member from the connector main body 1, and the positioning member 8 is formed in a square framework 8a as shown in FIG. 1. The mounting portion 10 is defined at an inner area of the square framework 8a, and bars 8b forming the sides of the framework 8a, respectively, are disposed across the upper surface of the contacting elements 4 group on respective rows arranged side by side. For isolating the adjacent contacting elements 4, the contacting nose portions 7 formed on the contacting elements 4 are inserted into the corresponding positioning holes 9 formed in the bars 8b.

The positioning knob portions 7 are disposed in the vicinity of the contacting nose portions 5 respectively, both portions 7 and 5 being projected upwardly from the contacting elements 4 respectively. The contacting nose portions 5 are linearly arranged along the inner edge of the square framework 8a. The positioning knob portions 7 are arranged at spaces in a slightly shifted manner in the direction where the contacting elements 4 are laid side by side (namely, longitudinal direction of the bars 8b), and the positioning holes 9 are arranged in such a manner as to correspond to the positioning knob portions 7. The foregoing arrangement of the positioning holes 9 is referred to as a staggered arrangement.

In FIGS. 1 and 2, the positioning member 8 is formed of the square framework 8a. However, the present invention includes a case where the positioning members 8 are separately arranged per each row of contacts 2.

Furthermore, FIG. 9 shows an example in which a plurality of positioning knob portions 7 are arranged in the direction where the contacting elements 4 extend. That is, a single positioning knob portion 7 is disposed as shown by the solid line of FIG. 9 or a plurality of positioning knob portions 7 are arranged side by side as shown by the imaginary lines. The contacting nose portions 5 may be arranged along the outer edge of each bar 8b.

Next, based on FIGS. 3, 4, 5, and 10, a construction specific to the second embodiment will be described. The connector main body 1 formed of an insulating material has a plurality of contacts 2 arranged in an array. Each contact 2 has the contacting element 4 which can be elastically shifted. A free end portion of the contacting element 4 projects from one side surface of the connector main body 1. The contacting element 4 is provided with a contacting nose portion 5 formed on a projecting end portion thereof and directing upward. A single number of or a plurality of positioning knob portions 7 are arranged side by side in the vicinity of the contacting nose portion 5.

Figure 3:
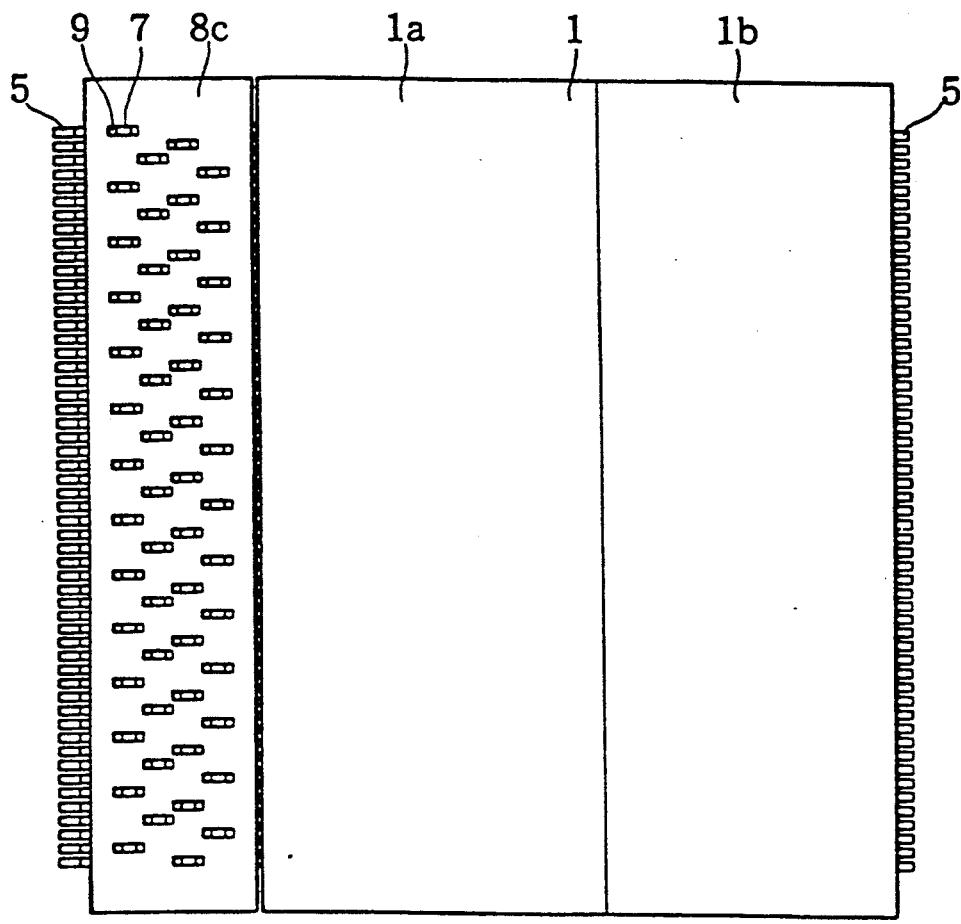
FIG. 3 is a plan view of a connector according to a second embodiment of the present invention.
Figure 4:
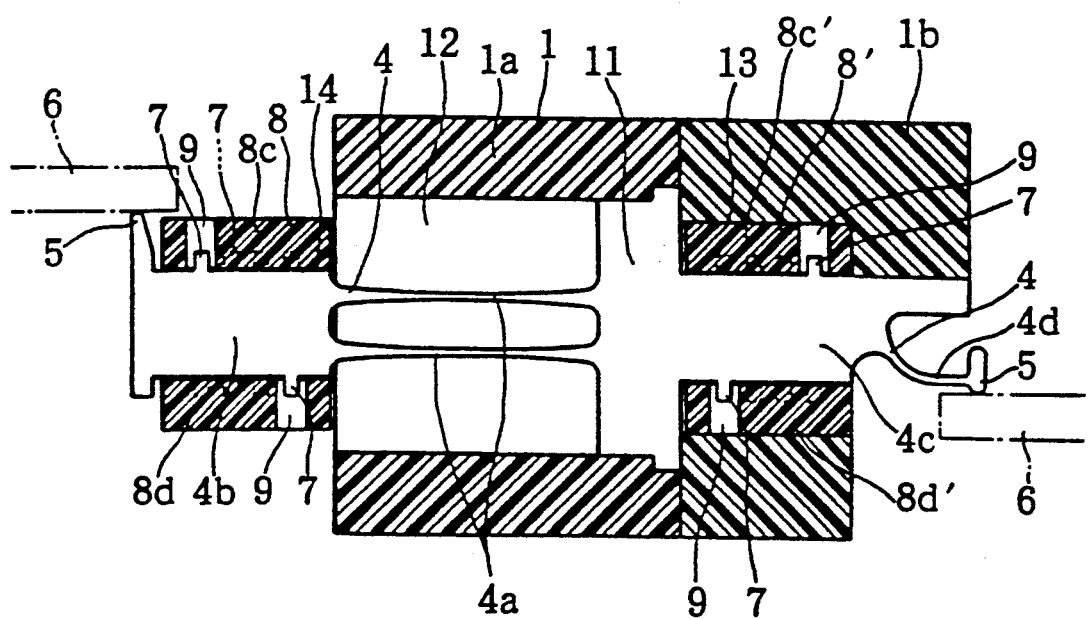
FIG. 4 is a sectional view of the connector of FIG. 3.

FIGS. 3 and 4 show a movable positioning member 8 and a stationary positioning member 8', respectively. Both the positioning members 8, 8' are disposed across the contacting elements 4 of the contacts 2 along each side surface of the connector main body 1. The movable positioning member 8 is movably disposed along one side surface of the connector main body 1 for movement upward and downward. The stationary positioning member 8' is integrally assembled within the connector main body 1. The positioning knob portions 7 projecting from the contacting elements 4 are inserted into the positioning members 8, 8', so that the contacting elements 4 are mutually positioned and isolated.

Figure 10:
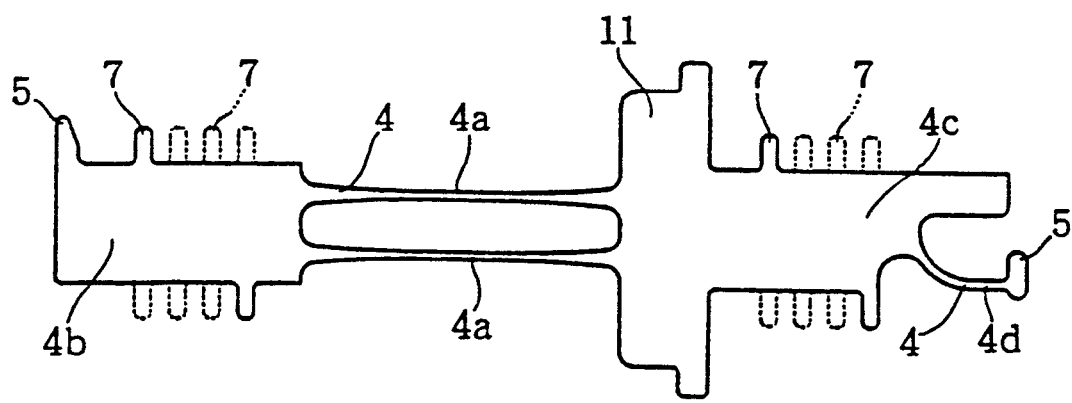
FIG. 10 is a side view of a contact according to the second embodiment.

Each contacting element 4, as shown in FIG. 10, has two spring portions 4a laterally extending in parallel relation. Both ends of the spring portion 4a are connected with each other. The spring portion 4a has a movable rigid element 4b extending from the area of connection at the free end thereof. The movable element 4b is provided at its upper end or lower edge with a single number of or a plurality of positioning knob portions 7. Furthermore, the movable element 4b is provided at its upper edge with the contacting nose portion 5 directing upward. The movable element 4b provided with the contacting nose portion 5 and the positioning knob portion 7 projects sideward from one side surface of the connector main body 1, and the movable positioning member 8 is mounted on the projecting portion. The contacting nose portion 5 projects sideward of the movable positioning member 8.

The connecting element 4 is provided at its portion for connecting its basal portion with an implanting portion 11 with respect to the connector main body 1. The spring portions 4a extending sideward from the implanting portion 11 are accommodated within a cavity 12 of the connector main body 1 such that the portions 4a can be freely shifted therein. The movable element 4b formed on the free end portion of the spring elements 4b projects outward from an opening of the cavity 12, and the positioning member 8 is mounted thereon.

A cavity 14 communicating with the cavity 12 is formed in the positioning member 8. The projecting end of the contacting element 4, i.e., movable element 4b, is inserted into the cavity 14, and the contacting portion 5 projects from the opening portion of the cavity 14. This contacting portion 5 is linearly disposed along the outer side edge of the positioning member 8.

Referring back to the positioning member 8, it has the bars 8c disposed across the upper surfaces of the movable elements 4b and the bars 8d disposed across the lower surfaces of the bars 8c. Both ends of the bars 8c and 8d are connected with each other at the ends of the rows of contacts through connecting means, respectively. The movable elements 4b are sandwiched between the bars 8c and 8d, respectively. The positioning knob portions 7 projecting upward from the upper edge of the movable elements 4b are inserted into the corresponding positioning holes 9 formed in the upper bars 8c, while the positioning knob portions 7 projecting downward from the lower edge of the movable elements 4b are inserted into the positioning holes 9 formed in the lower bars 8d in order to position the contacting elements at their upper and lower parts.

As means for connecting the upper bars 8c and the lower bars 8d, FIGS. 5 and 6 show an example wherein a nail portion 15 formed on an end portion of one of the upper and lower bars is engaged with a step portion formed on an end portion of the other bar.

On the other hand, the other contacting element 4 extends in the opposite direction to the extending direction of the above contacting element 4 from the implanting portion 11, and the free end of the contacting element 4 projects sideward from the connector main body. The contacting element 4 has a stationary element 4c extending from the implanting portion 11, and a spring portion 4d extending from the stationary element 4c. The spring portion 4d projects sideward of the connector main body 1, and the contacting nose portion 5 is formed on the projecting end. The stationary element 4c is disposed within the connector main body 1. The stationary element 4c is provided at its upper or lower edge with the positioning knob portion 7. On the other hand, the stationary positioning member 8' is disposed across the stationary element 4c and held within the connector main body 1. The positioning knob portions 7 are inserted into the corresponding positioning holes 9 formed in the positioning member 8' so that the contacting elements 4 are correctly positioned and mutually isolated. The positioning member 8' comprises an upper bar 8c' and a lower bar 8d' as in the second embodiment.

The connector main body 1 is of a structure dividing into two left and right portions or blocks. The implanting portion is press fitted into the cavity 12 formed in one block 1a so as to be integral therewith, while a cavity 13 communicating with the cavity 12 is formed in the other block 1b. The stationary positioning member 8' and the contacting element 4 are received and held in the cavity 13, and the spring element 4d projects sideward from the opening portion of the cavity 13.

The electric part 6, for example, a wiring board, as shown in FIG. 4, is press contacted with the contacting nose portion 5 projecting sideward of the connector main body 1 and sideward of the respective positioning members 8, 8'. The movable positioning member 8 is shiftable upwardly and downwardly in accordance with the elastic shifting of the contacting element 4 as described. By urging the electric part 6 against the contacting nose portion 5, the contacting element 4 is flexed downward, and the contacting nose portion 5 is press contacted with the terminal of the electric part by reaction of the elastic element 4.

In the third embodiment shown in FIG. 6, the contacting element 4 of the second embodiment is of a structure capable of clamping and contacting the terminal portion of the electric part.

Figure 7:
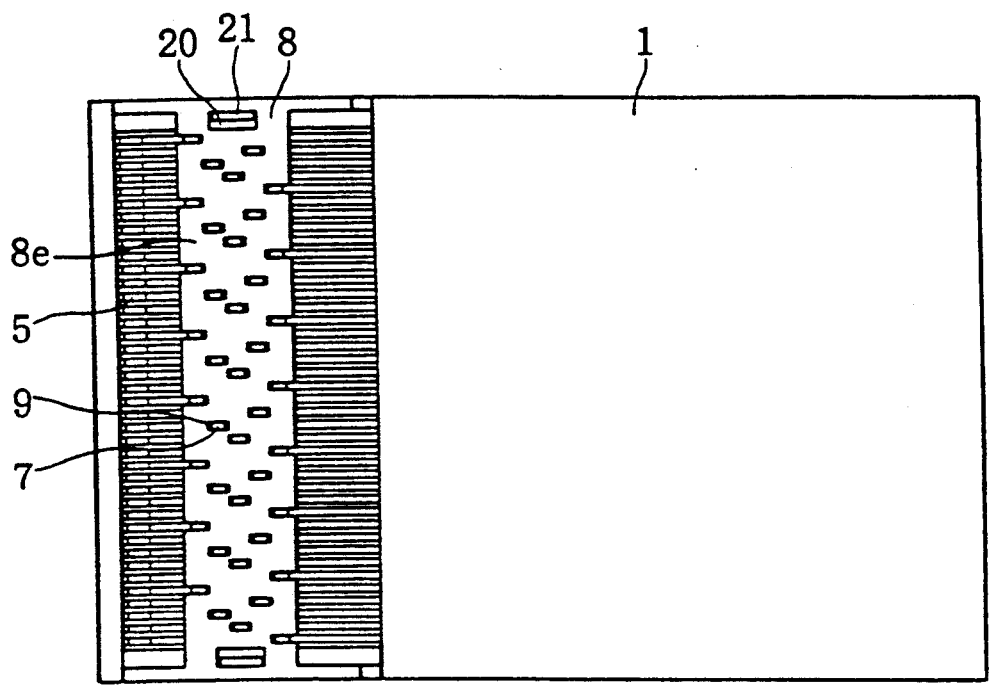
FIG. 7 is a plan view of a connector according to a fourth embodiment of the present invention.
Figure 11:
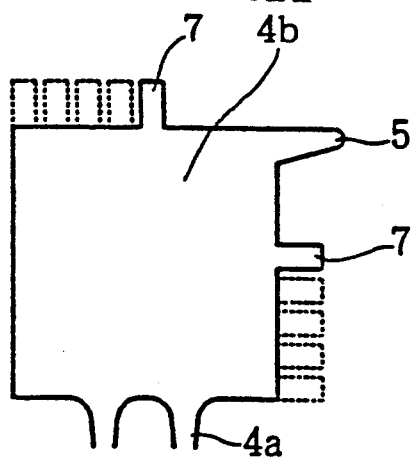
FIG. 11 is a side view of a contact in the fourth embodiment.

Next, referring to FIGS. 7, 8 and 11, a construction specific to the fourth embodiment will be described. In this embodiment, the movable element 4b extending from the spring portion 4a in the second embodiment is provided at an upper end thereof with a positioning knob portion 7 directing upward, and the movable element is provided at its side edge with a positioning knob portion 7 directing sideward. Furthermore, the movable element 4b is provided with bars 8e and 8f disposed across the upper and side surfaces respectively. The positioning knob portions 7 are inserted into the corresponding positioning holes 9 formed in the bars 8e and 8f in order to obtain a relative position between each contacting element 4 and contacting nose portion 5.

The bars 8e and 8f forming the positioning member 8 are shiftable upward and downward in accordance with the elastic shifting of the contacting elements 4. FIG. 8 shows their concrete example. As shown in FIG. 8, an inclination surface 16 is formed at a corner portion of one side portion of the connector main body 1. On the other hand, one sides of side plates 17 disposed at both ends of the upper and side bars 8e and 8f, respectively, are served as inclination surfaces 19 synchronous with the inclination surface 16, and a space 18 is formed between the inclination surfaces 16 and 19. Both the positioning members 8 are allowed to move upward and downward within the range of the space 18.

Figure 8:
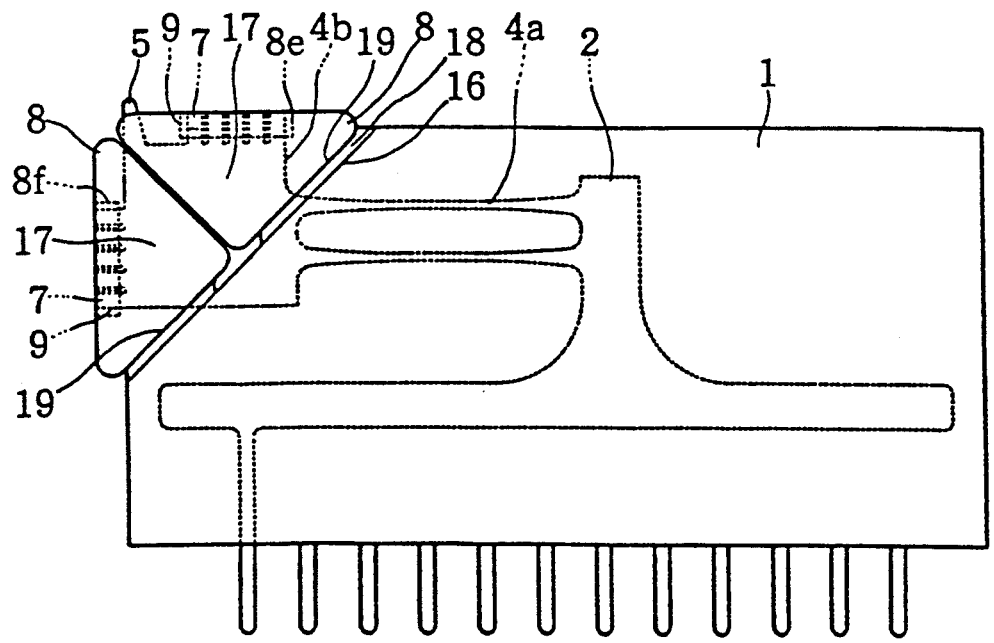
FIG. 8 is a side view of the above.
Figure 9:
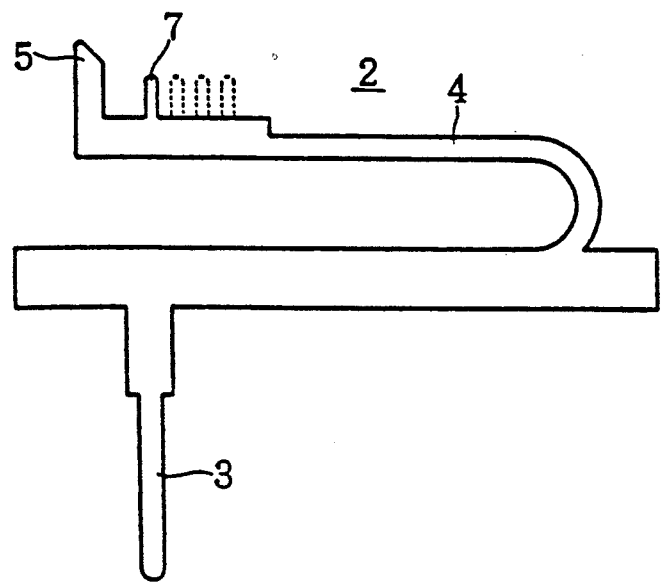
FIG. 9 is a side view of a contact according to the first embodiment.

In FIG. 8, the side plates 17 are formed in triangular shapes respectively. One sides of the triangular side plates 17 are placed opposite to and in parallel with the inclination surface 16, and other one sides thereof are placed opposite to each other, and the remaining sides are generally in alignment with the upper and side surfaces of the connector main body 1.

Retaining elements 21 projecting from the connector main body side are inserted into holes 20 formed, for example, in both ends of the bars 8e and 8f, and a play corresponding to the space 18 is formed at an engaging portion of each retaining element 21.

According to the present invention, it is no more required to dispose a partition wall between adjacent contacting elements or between adjacent contacting nose portions as in the prior art. As a consequence, adjacent contacting elements and therefore adjacent contacting nose portions can be isolated properly by inserting the positioning knob portions separately provided from the contacting nose portions of the contacting elements into the corresponding positioning holes of the positioning member separately provided from the connector main body.

Therefore, the adjacent contacting elements can be isolated by linearly arranging the contacting nose portions and by arranging the positioning knob portions and the positioning holes in staggered relation. As a result, the positioning knob portions and positioning holes can be formed in position convenient in view of molding without getting limitation from the above arrangement of the contacting nose portions. As a result, the present invention can effectively cope with the requirement for forming contacts at narrower pitches.

Furthermore, since partition walls are no more disposed between adjacent contacting elements and between adjacent contacting nose portions as in the prior art, the requirement for realizing narrower pitches is not disturbed. By arranging the positioning members instead of the partition walls such that the positioning members can be shifted in accordance with the contacting elements, mutual positioning and mutual isolation of the contacting elements can be obtained properly during their shifting process. Moreover, unfavorable displacement during the shifting process can be prevented effectively.

What is claimed is:

1. A connector comprising a connector main body formed of an insulating material, and a plurality of contacts arranged in array on said connector main body, said contacts each having an elastically shiftable contacting element, said contacting element being provided with a contacting nose portion, said contacting nose portion being press-contacted with a terminal of an electric part by resilient force of said contacting element, wherein positioning knob portions are formed in the vicinity of said contacting nose portions of said contacting elements, a positioning member formed of an insulating material separately from said connector main body being disposed across said contact array of said contacts arranged in array, a plurality of positioning holes corresponding to said positioning knob portions being formed in said positioning member, adjacent said contacting elements being isolated by inserting said positioning knob portions into said positioning holes respectively.

2. A connector as claimed in claim 1, wherein said positioning member can be shifted in accordance with said contacting elements.

3. A connector as claimed in claim 1, wherein said positioning holes of said positioning member and said positioning knob portions of said contacting elements are arranged in triggered relation, and said contacting nose portions are linearly arranged.

4. A connector comprising a connector main body formed of an insulating material, a plurality of contacts had by said connector main body, elastically shiftable contacting elements formed on said contacts respectively, one end portions of said contacting elements being projected from a side surface of said connector main body, a contacting nose portion and a positioning knob portion formed side by side on a projecting end portion of each of said contacting elements, said contacting nose portion being press-contacted with a terminal of an electric part by resilient force of said contacting element, and a positioning member formed of an insulating material separately from said connector main body and movable along a side surface of said connector main body, a plurality of positioning holes corresponding to said positioning knob portions being formed in said positioning member, adjacent said contacting elements being isolated by inserting said positioning knob portions into said positioning holes respectively, said positioning member being shifted in accordance with said contacting elements which are mutually isolated.

5. A connector comprising a connector main body formed of an insulating material, a mounting portion for an electric part disposed at a central portion of said connector main body, a plurality of contacts arranged in array along at least two opposing sides of said mounting portion, elastically shiftable contacting elements formed on said contacts and extending toward said mounting portion, and contacting nose portions formed on said contacting elements respectively, said contacting nose portions being press-contacted with terminals of said electric part by resilient force of said contacting elements, wherein positioning knob portions are formed in the vicinity of said contacting nose portions of said contacting elements, a positioning member being disposed across said elastic shiftable contacting elements of said contacts arranged in array along each side, a plurality of positioning holes corresponding to said positioning knob portions being formed in said positioning member, adjacent said contacting elements being isolated by inserting said positioning knob portions into said positioning holes respectively, said positioning member being shifted in accordance with said contacting elements which are mutually isolated.

6. A connector as claimed in claim 5, wherein said positioning member is formed of a framework member, said positioning holes being formed in bars which form each side of said framework member, said contacting nose portions being linearly arranged along an inner or outer edge of said bars.

* * * * *